United States Patent
Amano et al.

(10) Patent No.: US 9,947,729 B2
(45) Date of Patent: Apr. 17, 2018

(54) ORGANIC ELECTROLUMINESCENT ELEMENT, LIGHTING DEVICE, AND LIGHTING SYSTEM

(71) Applicant: Kabushiki Kaisha Toshiba, Minato-ku (JP)

(72) Inventors: Akio Amano, Machida (JP); Tomoko Sugizaki, Kawasaki (JP); Daimotsu Kato, Kawasaki (JP); Tomio Ono, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 17 days.

(21) Appl. No.: 15/058,323

(22) Filed: Mar. 2, 2016

(65) Prior Publication Data

US 2016/0260784 A1   Sep. 8, 2016

(30) Foreign Application Priority Data

Mar. 5, 2015 (JP) ................. 2015-043427

(51) Int. Cl.
*H01L 27/32* (2006.01)
*H01L 51/00* (2006.01)
*H01L 51/52* (2006.01)

(52) U.S. Cl.
CPC ...... *H01L 27/3244* (2013.01); *H01L 27/3225* (2013.01); *H01L 51/0037* (2013.01);
(Continued)

(58) Field of Classification Search
CPC ............ H01L 27/3225; H01L 27/3244; H01L 51/0037; H01L 51/5212; H01L 51/5218; H01L 51/5221; H01L 51/5275
See application file for complete search history.

(56) References Cited

U.S. PATENT DOCUMENTS

2008/0088227 A1   4/2008 Lee
2009/0309094 A1*  12/2009 Frey ................ C09K 11/06
                                                                257/40
(Continued)

FOREIGN PATENT DOCUMENTS

JP   2007-200788 A   8/2007
JP   2008-103305 A   5/2008
(Continued)

*Primary Examiner* — Allan R Wilson
(74) *Attorney, Agent, or Firm* — Oblon, McClelland, Maier & Neustadt, L.L.P.

(57) ABSTRACT

According to one embodiment, an organic electroluminescent element includes a substrate, a first electrode, a second electrode, an organic layer and a first conductive unit. The substrate is light-transmissive. The second electrode is provided between the substrate and the first electrode. The second electrode is light-transmissive. The second electrode includes a first region and a second region. A direction connecting the first region and the second region intersects a first direction connecting the substrate and the first electrode. The organic layer is provided between the second electrode and the first electrode. The first conductive unit is provided between the first region and a portion of the substrate. The first conductive unit is electrically connected with the second electrode. The first conductive unit includes a third region and a fourth region. A portion of the fourth region is disposed between the substrate and at least a portion of the third region.

19 Claims, 6 Drawing Sheets

(52) U.S. Cl.
CPC ...... *H01L 51/5212* (2013.01); *H01L 51/5218* (2013.01); *H01L 51/5221* (2013.01); *H01L 51/5275* (2013.01); *H01L 2251/558* (2013.01)

(56) References Cited

U.S. PATENT DOCUMENTS

| | | |
|---|---|---|
| 2010/0244710 A1 | 9/2010 | Obata et al. |
| 2010/0258797 A1 | 10/2010 | Yamamoto et al. |
| 2012/0018767 A1 | 1/2012 | Ikeda et al. |
| 2012/0097939 A1* | 4/2012 | Fujita ................. H01L 27/3202 257/40 |
| 2012/0286651 A1* | 11/2012 | Levermore ............ H05B 33/10 313/504 |
| 2013/0175562 A1* | 7/2013 | Schubert ............. H01L 33/0079 257/98 |
| 2013/0221341 A1 | 8/2013 | Iwabuchi et al. |
| 2015/0221677 A1* | 8/2015 | Okabe ................... G02F 1/1368 349/43 |
| 2015/0364713 A1* | 12/2015 | Takeda ................. H01L 51/445 257/40 |
| 2017/0104174 A1* | 4/2017 | Sakaguchi .......... H01L 51/5212 |

FOREIGN PATENT DOCUMENTS

| | | |
|---|---|---|
| JP | 2010-251401 A | 11/2010 |
| JP | 2011-108637 A | 6/2011 |
| JP | 2012-49112 A | 3/2012 |
| JP | 2012-94348 A | 5/2012 |
| JP | 2014-150030 | 8/2014 |

* cited by examiner

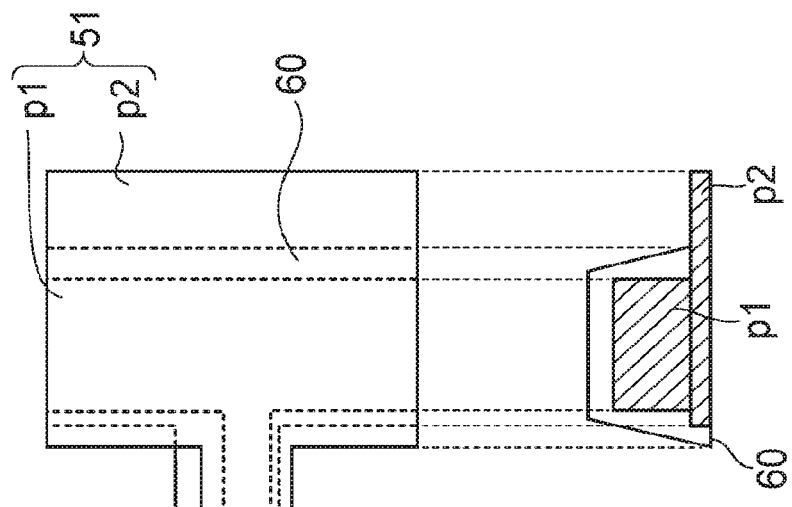
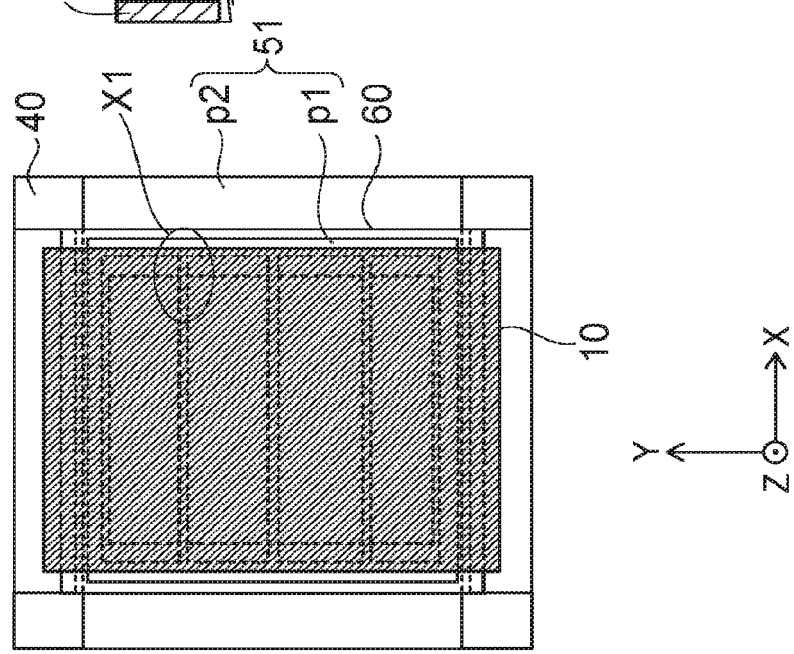
FIG. 4A
FIG. 4B

US 9,947,729 B2

ORGANIC ELECTROLUMINESCENT ELEMENT, LIGHTING DEVICE, AND LIGHTING SYSTEM

CROSS-REFERENCE TO RELATED APPLICATIONS

This application is based upon and claims the benefit of priority from Japanese Patent Application No. 2015-043427, filed on Mar. 5, 2015; the entire contents of which are incorporated herein by reference.

FIELD

Embodiments described herein relate generally to an organic electroluminescent element, a lighting device and a lighting system.

BACKGROUND

In recent years, organic electroluminescent elements in applications such as planar light sources, etc., are drawing attention. It is expected that applications that could not be realized by conventional lighting appliances and light sources will be realized by an organic electroluminescent element due to the features of being thin, lightweight, and having planar light emission. In the organic electroluminescent element, an organic light emitting layer is provided between a first electrode (an anode) and a second electrode (a cathode). Light is emitted from the organic light emitting layer by applying a voltage between these electrodes. There is a lighting device in which the organic electroluminescent element is used as the light source. There is a lighting system that includes multiple organic electroluminescent elements and a controller that controls the multiple organic electroluminescent elements. It is desirable for the organic electroluminescent element to have a greater surface area.

BRIEF DESCRIPTION OF THE DRAWINGS

FIG. 4A and FIG. 4B are schematic perspective plan views showing the organic electroluminescent element according to the second embodiment;

DETAILED DESCRIPTION

Figure 1:
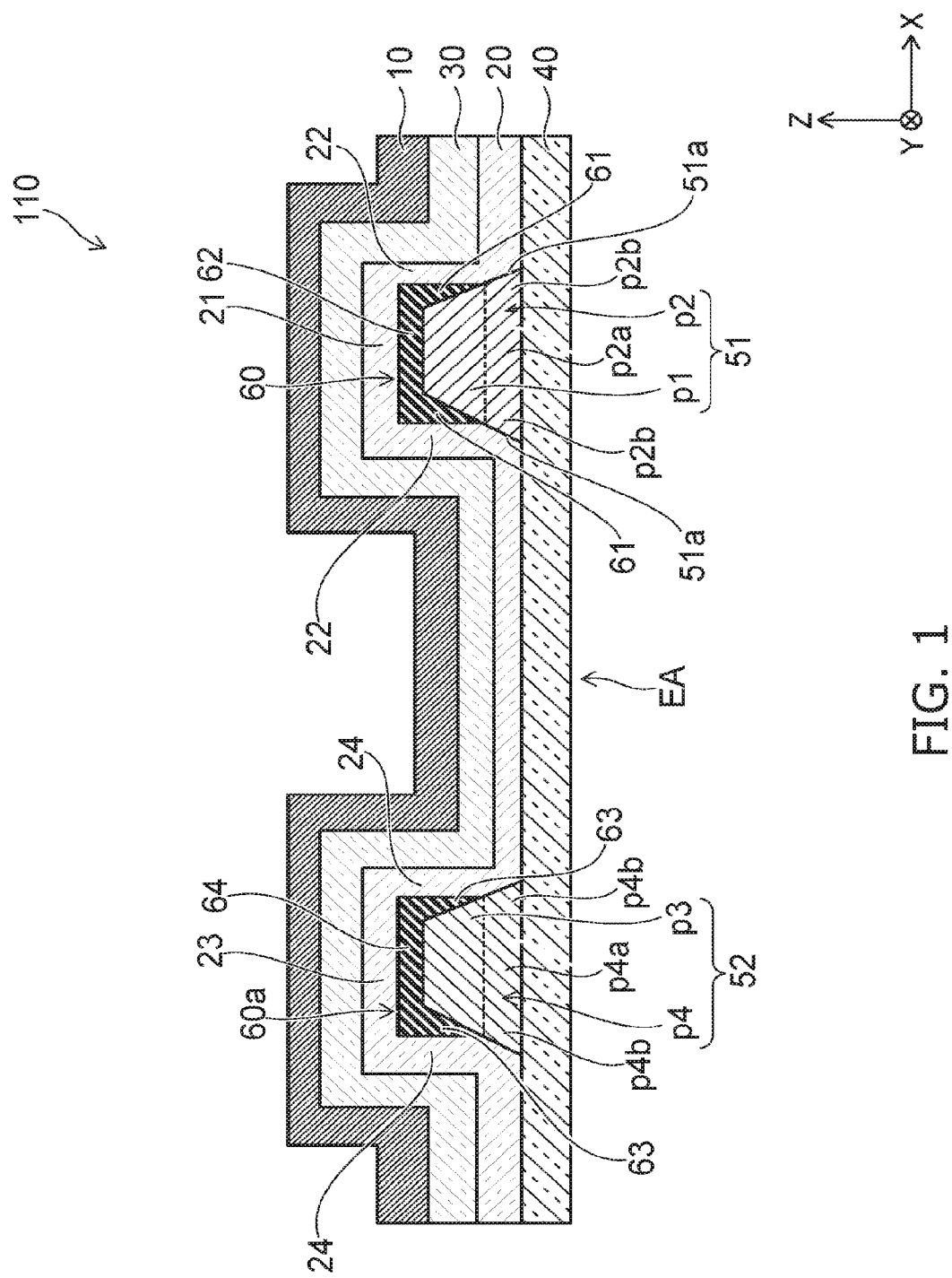
FIG. 1 is a schematic cross-sectional view showing an organic electroluminescent element according to a first embodiment.

According to one embodiment, an organic electroluminescent element includes a substrate, a first electrode, a second electrode, an organic layer and a first conductive unit. The substrate is light-transmissive. The second electrode is provided between the substrate and the first electrode. The second electrode is light-transmissive. The second electrode includes a first region and a second region. A direction connecting the first region and the second region intersects a first direction connecting the substrate and the first electrode. The organic layer is provided between the second electrode and the first electrode. The first conductive unit is provided between the first region and a portion of the substrate. The first conductive unit is electrically connected with the second electrode. The first conductive unit includes a third region and a fourth region. A portion of the fourth region is disposed between the substrate and at least a portion of the third region.

According to one embodiment, a lighting device includes an organic electroluminescent element and a power supply unit. The organic electroluminescent element includes a substrate, a first electrode, a second electrode, an organic layer and a first conductive unit. The substrate is light-transmissive. The second electrode is provided between the substrate and the first electrode. The second electrode is light-transmissive. The second electrode includes a first region and a second region. A direction connecting the first region and the second region intersects a first direction connecting the substrate and the first electrode. The organic layer is provided between the second electrode and the first electrode. The first conductive unit is provided between the first region and a portion of the substrate. The first conductive unit is electrically connected with the second electrode. The first conductive unit includes a third region and a fourth region. A portion of the fourth region is disposed between the substrate and at least a portion of the third region. The power supply unit is electrically connected with the first electrode and the second electrode. The power supply unit supplies a current to the organic electroluminescent element.

According to one embodiment, a lighting system includes a plurality of organic electroluminescent elements and a controller. Each of the organic electroluminescent elements includes a substrate, a first electrode, a second electrode, an organic layer and a first conductive unit. The substrate is light-transmissive. The second electrode is provided between the substrate and the first electrode. The second electrode is light-transmissive. The second electrode includes a first region and a second region. A direction connecting the first region and the second region intersects a first direction connecting the substrate and the first electrode. The organic layer is provided between the second electrode and the first electrode. The first conductive unit is provided between the first region and a portion of the substrate. The first conductive unit is electrically connected with the second electrode. The first conductive unit includes a third region and a fourth region. A portion of the fourth region is disposed between the substrate and at least a portion of the third region. The controller is electrically connected with one of the plurality of organic electroluminescent elements. The controller controls an intensity of a light emission of the one of the plurality of organic electroluminescent elements.

Various embodiments of the invention will be described hereinafter with reference to the accompanying drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

First Embodiment

FIG. 1 is a schematic cross-sectional view showing an organic electroluminescent element according to a first embodiment.

The organic electroluminescent element 110 according to the embodiment includes a first electrode 10, a second electrode 20, an organic layer (an organic light emitting layer) 30, a substrate 40, a first conductive unit 51, a second conductive unit 52, and a first insulating layer 60.

The substrate 40 is, for example, light-transmissive. The substrate 40 is, for example, a transparent substrate. The substrate 40 includes, for example, an inorganic material such as alkali-free glass, quartz glass, etc. The substrate 40 may include a plastic such as polyethylene, polyethylene terephthalate (PET), polyethylene naphthalate (PEN), polyimide, polyamide, polyamide-imide, a liquid crystal polymer, a cycloolefin polymer, etc. The substrate 40 may include a polymer film, etc. The substrate 40 is, for example, a glass substrate. It is favorable to use a transparent material to extract the light emission. The configuration, structure, size, etc., of the substrate 40 are appropriately selected according to the application, the purpose, etc.

Here, a direction perpendicular to the substrate 40 is taken as a Z-axis direction. One direction parallel to the substrate 40 is taken as an X-axis direction. One direction perpendicular to the X-axis direction and the Z-axis direction is taken as a Y-axis direction. The X-axis direction and the Y-axis direction are parallel to the substrate 40. The X-axis direction and the Y-axis direction are perpendicular to the Z-axis direction. The Z-axis direction corresponds to the thickness direction of the substrate 40.

The first electrode 10 is, for example, light-reflective. The first electrode 10 functions as a cathode. The light reflectance of the first electrode 10 is higher than the light reflectance of the second electrode 20. The first electrode 10 is separated from the second electrode 20 in the first direction. In the embodiment, the first direction is the direction from the substrate 40 toward the first electrode 10. The first direction is, for example, the Z-axis direction. The second direction is, for example, the X-axis direction.

The first electrode 10 includes, for example, at least one of aluminum or silver. For example, the first electrode 10 includes an aluminum film. An alloy of silver and magnesium may be used as the first electrode 10. Calcium may be added to the alloy. The first electrode 10 is not limited to these materials. For example, the first electrode 10 is provided in a fine wire configuration or a lattice configuration that cannot be visually confirmed. For example, the fine wire configuration or the lattice configuration that cannot be visually confirmed is provided with a line width and a spacing of about 100 micrometers (μm)/100 μm or about 100 μm/500 μm. For example, the pattern configuration of the first electrode 10 may be a comb-like configuration.

The second electrode 20 is, for example, light-transmissive. The second electrode 20 functions as an anode. The second electrode 20 is, for example, a transparent electrode. The second electrode 20 is provided between the substrate 40 and the first electrode 10. The light extraction efficiency can be increased by using a low refractive index material as the transparent electrode. The second electrode 20 includes, for example, polyethylene dioxythiophene (PEDOT) which is one coating material. PEDOT has superior light transmissivity when used as a thin film. A general method for coating PEDOT uses an aqueous dispersion made of a mixture of PEDOT and polystyrenesulfonate (PSS), i.e., PEDOT-PSS.

The organic light emitting layer 30 is, for example, light-transmissive. The organic light emitting layer 30 is, for example, transparent. The organic light emitting layer 30 overlaps the substrate 40 in the Z-axis direction. The organic light emitting layer 30 is provided between the first electrode 10 and the second electrode 20. The organic light emitting layer 30 is electrically connected with both the first electrode 10 and the second electrode 20. In the specification of the application, the state of being electrically connected includes not only the state of being in direct contact but also the state in which another conductive member or the like is interposed therebetween.

The thickness (the length in the Z-axis direction) of the first electrode 10 is, for example, not less than 10 nanometers (nm) and not more than 300 nm. The thickness of the second electrode 20 is, for example, not less than 10 nm and not more than 500 nm. More favorably, the thickness is not less than 50 nm and not more than 200 nm. The thickness of the organic light emitting layer 30 is, for example, not less than 50 nm and not more than 500 nm.

From the perspective of the light extraction efficiency, it is favorable for the refractive index of the second electrode 20 to be higher than the refractive index of the substrate 40 and lower than the refractive index of the organic light emitting layer 30. More favorably, the refractive index of the second electrode 20 is 1.6 or less. For example, the refractive index of the substrate 40 is 1.5. The refractive index of the second electrode 20 is 1.6. The refractive index of the organic light emitting layer 30 is 1.8.

A current is caused to flow in the organic light emitting layer 30 by using the second electrode 20 and the first electrode 10. Thereby, the organic light emitting layer 30 emits light. For example, when the current flows in the organic light emitting layer 30, electrons and holes recombine and generate excitons. For example, the organic light emitting layer 30 emits light by utilizing the emission of light when the excitons undergo radiative deactivation.

Figure 2:
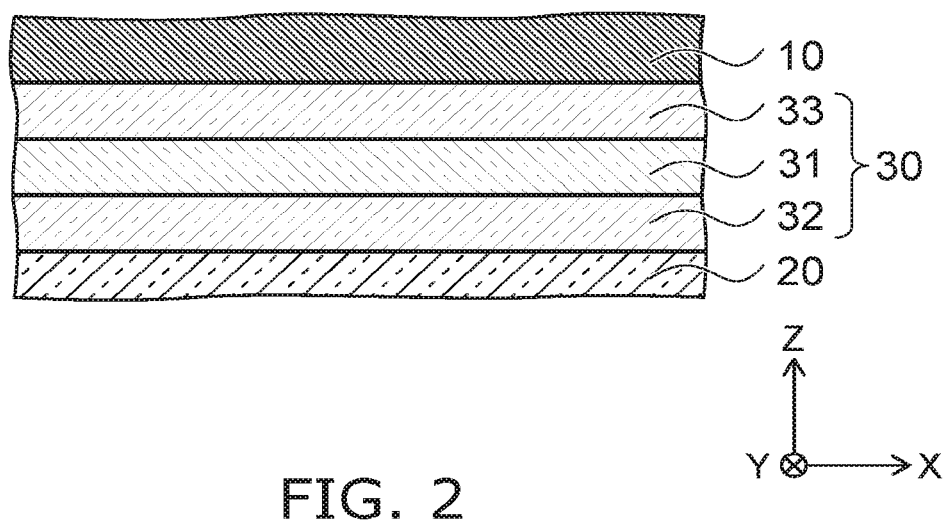
FIG. 2 is a schematic cross-sectional view showing a portion of the organic electroluminescent element according to the first embodiment.

FIG. 2 is a schematic cross-sectional view showing a portion of the organic electroluminescent element according to the first embodiment.

As shown in FIG. 2, the organic light emitting layer 30 includes a first layer 31. The organic light emitting layer 30 may further include at least one of a second layer 32 or a third layer 33 as necessary. The first layer 31 emits light of a wavelength of visible light. The second layer 32 is provided between the first layer 31 and the second electrode 20. The third layer 33 is provided between the first layer 31 and the first electrode 10.

The first layer 31 may include, for example, a material such as $Alq_3$ (tris(8-hydroxyquinolinolato)aluminum), F8BT (poly(9,9-dioctylfluorene-co-benzothiadiazole), PPV (poly-paraphenylene vinylene), etc. The first layer 31 may include a mixed material of a host material and a dopant added to the host material. For example, CBP (4,4'-N,N'-bis dicarbazolyl-biphenyl), BCP (2,9-dimethyl-4,7 diphenyl-1,10-phenanthroline), TPD (4,4,-bis-N-3 methylphenyl-N-phenylamino biphenyl), PVK (polyvinyl carbazole), PPT (poly (3-phenylthiophene)), etc., may be used as the host material. For example, Flrpic (iridium (III)bis(4,6-d i-fluorophenyl)-pyridinate-N,C2'-picolinate), $Ir(ppy)_3$ (tris(2-phenylpyridine)iridium), Flr6 (bis(2,4-difluorophenylpyridinato)-tetrakis (1-pyrazolyl)borate-iridium (III)), etc., may be used as the dopant material.

For example, the second layer 32 functions as a hole injection layer. The hole injection layer includes, for example, at least one of PEDOT-PSS (poly(3,4-ethylenedioxythiophene)-poly(styrenesulfonic acid)), CuPc (copper phthalocyanine), MoO$_3$ (molybdenum trioxide), or the like. For example, the second layer 32 functions as a hole transport layer. The hole transport layer includes, for example, at least one of α-NPD (4,4'-bis[N-(1-naphthyl)-N-phenylamino]biphenyl), TAPC (1,1-bis[4-[N,N-di (p-tolyl)amino]phenyl]cyclohexane), m-MTDATA (4,4',4"-tris[phenyl(nn-tolyl)amino]triphenylamine), TPD (bis(3-methylphenyl)-N,N'-diphenylbenzidine), TCTA (4,4',4"-tri(N-carbazolyl)triphenylamine), or the like. For example, the second layer 32 may have a stacked structure of the layer that functions as the hole injection layer and the layer that functions as the hole transport layer. The second layer 32 may include a layer other than the layer that functions as the hole injection layer and the layer that functions as the hole transport layer.

The third layer 33 may include, for example, a layer that functions as an electron injection layer. The electron injection layer includes, for example, at least one of lithium fluoride, cesium fluoride, lithium quinoline complex, or the like. The third layer 33 may include, for example, a layer that functions as an electron transport layer. The electron transport layer includes, for example, at least one of Alq$_3$ (tris(8 quinolinolato)aluminum (III)), BAlq (bis(2-methyl-8-quinolinolato) (p-phenylphenolate)aluminum), Bphen (bathophenanthroline), 3TPYMB (tris[3-(3-pyridyl)-mesityl]borane), or the like. For example, the third layer 33 may have a stacked structure of the layer that functions as the electron injection layer and the layer that functions as the electron transport layer. The third layer 33 may include a layer other than the layer that functions as the electron injection layer and the layer that functions as the electron transport layer.

For example, the light that is emitted from the organic light emitting layer 30 is substantially white light. In other words, the light that is emitted from the organic electroluminescent element 110 is white light. Here, "white light" is substantially white and includes, for example, white light that is reddish, yellowish, greenish, bluish, violet-tinted, etc.

As shown in FIG. 1, the first conductive unit 51 is provided between the substrate 40 and the second electrode 20. The first conductive unit 51 includes a side surface 51a intersecting the Z-axis direction. In the example, the side surface 51a is tilted with respect to the Z-axis direction. The side surface 51a is provided in a tapered configuration.

The first conductive unit 51 functions as a supplemental interconnect layer. The first conductive unit 51 includes, for example, at least one element selected from the group consisting of Mo, Ta, Nb, Al, Ni, and Ti. For example, a mixed film including elements selected from the group may be used as the first conductive unit 51. A stacked film including these elements may be used as the first conductive unit 51. The first conductive unit 51 may include, for example, a stacked film of Nb/Mo/Al/Mo/N b.

For example, the first conductive unit 51 may be a thin metal interconnect of about 100 nm. However, a certain amount of surface area is necessary to ensure sufficient conductivity. In such a case, the light emission surface area is sacrificed. Therefore, it is favorable to ensure the conductivity by making the first conductive unit 51 somewhat thick. For example, it is favorable for the thickness of the first conductive unit 51 to be not less than 10 nm and not more than 800 nm. The second conductive unit 52 is similar to the first conductive unit 51.

The first insulating layer 60 may include an insulative material. The first insulating layer 60 includes, for example, a resin material such as a polyimide resin, an acrylic resin, etc., an inorganic material such as a silicon oxide film (e.g., SiO$_2$), a silicon nitride film (e.g., SiN), a silicon oxynitride film, etc. The first insulating layer 60 is not limited to these materials. It is favorable for the thickness of the first insulating layer 60 to be, for example, not less than 100 nm and not more than 1 μm.

In the embodiment, the second electrode 20 is provided between the substrate 40 and the first electrode 10. The second electrode 20 includes a first electrode region (a first region) 21 and a second electrode region (a second region) 22. The direction connecting the first electrode and the second electrode region 22 intersects the Z-axis direction.

The first conductive unit 51 is provided between the first electrode region 21 and a portion of the substrate 40 and is electrically connected with the second electrode 20. The first conductive unit 51 includes a first conductive region (a third region) p1 and a second conductive region (a fourth region) p2. A portion p2a of the second conductive region p2 is disposed between the substrate 40 and at least a portion of the first conductive region p1.

The first insulating layer 60 includes a first insulating region (a fifth region) 61. The first insulating region 61 is provided between the first conductive region p1 and the second electrode region 22 in the X-axis direction.

Specifically, one other portion p2b of the second conductive region p2 does not overlap the first insulating region 61 in the Z-axis direction. For example, the one other portion p2b of the second conductive region p2 contacts the second electrode 20. In other words, a portion of the first conductive unit 51 which is the supplemental interconnect is exposed from the first insulating layer 60 and electrically connects the second electrode 20 of PEDOT, etc.

The first insulating layer 60 may further include a second insulating region (a sixth region) 62. The second insulating region 62 is provided between the first conductive unit 51 and the first electrode region 21 of the second electrode 20.

Here, for example, a transmission-type electroluminescent panel may be considered as one method for utilizing the organic electroluminescent element. In the case of the transmission-type electroluminescent panel, compared to a conventional panel, it is necessary to improve the characteristics such as the luminance, the durability, etc., because the light emission surface area decreases. To improve the characteristics, it is important not only to develop materials and optimize the diode configuration but also to optimize the light extraction structure.

Therefore, it may be considered to employ an anode material having a low refractive index to increase the light extraction efficiency. For example, a coating material such as PEDOT described above is favorable as the low refractive index material included in the anode material. The conductivity of PEDOT is lower than the conductivity of an indium tin oxide (ITO) film which is a conventional transparent anode. Therefore, it is difficult to increase the surface area of the organic electroluminescent element. To supplement the low conductivity and increase the surface area, a method may be considered in which a supplemental interconnect and an insulating layer are provided, etc. The insulating layer is provided between the supplemental interconnect and the cathode to prevent shorts.

However, in the case where a coating material such as PEDOT is used as the anode, it is difficult to perform patterning of the supplemental interconnect and the insulating layer using a wet process such as photolithography, etc., after forming PEDOT on the substrate by coating. In the case where PEDOT is formed by coating after forming the supplemental interconnect and the insulating layer on the substrate, the electrical connection (the contact) of the supplemental interconnect cannot be obtained.

Conversely, in the embodiment, when forming the first conductive unit 51 as the supplemental interconnect, a portion of the first conductive unit 51 is exposed from the first insulating layer 60 and electrically connected with the second electrode 20 of PEDOT, etc. Thereby, even in the case where PEDOT is used as the anode, the electrical connection of the supplemental interconnect can be obtained. In other words, a greater surface area can be realized by the supplemental interconnect while increasing the light extraction efficiency by using PEDOT.

In the example, the second conductive unit 52 is arranged with the first conductive unit 51 in the X-axis direction. A light emitting region EA is provided in the organic electroluminescent element 110. The second electrode 20 includes a third electrode region (a seventh region) 23 and a fourth electrode region (an eighth region) 24. The direction connecting the first electrode region 21 and the third electrode region 23 is aligned with the X-axis direction. The direction connecting the second electrode region 22 and the fourth electrode region 24 is aligned with the X-axis direction.

The second conductive unit 52 is provided between the third electrode region 23 and one other portion of the substrate 40 and is electrically connected with the second electrode 20. The second conductive unit 52 includes a third conductive region (a ninth region) p3 and a fourth conductive region (a tenth region) p4. A portion p4a of the fourth conductive region p4 is disposed between the substrate 40 and at least a portion of the third conductive region p3.

The organic electroluminescent element 110 further includes a second insulating layer 60a. The second insulating layer 60a includes a third insulating region (an eleventh region) 63. The third insulating region 63 is provided between the third conductive region p3 and the fourth electrode region 24 in the X-axis direction.

The third insulating region 63 and one other portion p4b of the fourth conductive region p4 do not overlap in the Z-axis direction. For example, the one other portion p4b of the fourth conductive region p4 contacts the second electrode 20. In other words, a portion of the second conductive unit 52 which is the supplemental interconnect is exposed from the first insulating layer 60 and electrically connected with the second electrode 20 of PEDOT, etc. The second insulating layer 60a may further include a fourth insulating region (a twelfth region) 64. The fourth insulating region 64 is provided between the second conductive unit 52 and the third electrode region 23.

The light emitting region EA is disposed between the first conductive unit 51 and the second conductive unit 52. The first electrode 10, the second electrode 20, the organic layer 30, and the substrate 40 are stacked in the light emitting region EA. The second electrode 20 contacts the substrate 40 in the light emitting region EA. The light emitted from the organic layer 30 in the light emitting region EA is emitted to the outside.

Thus, according to the embodiment, an organic electroluminescent element suited to a greater surface area can be provided.

Second Embodiment

Figure 3:
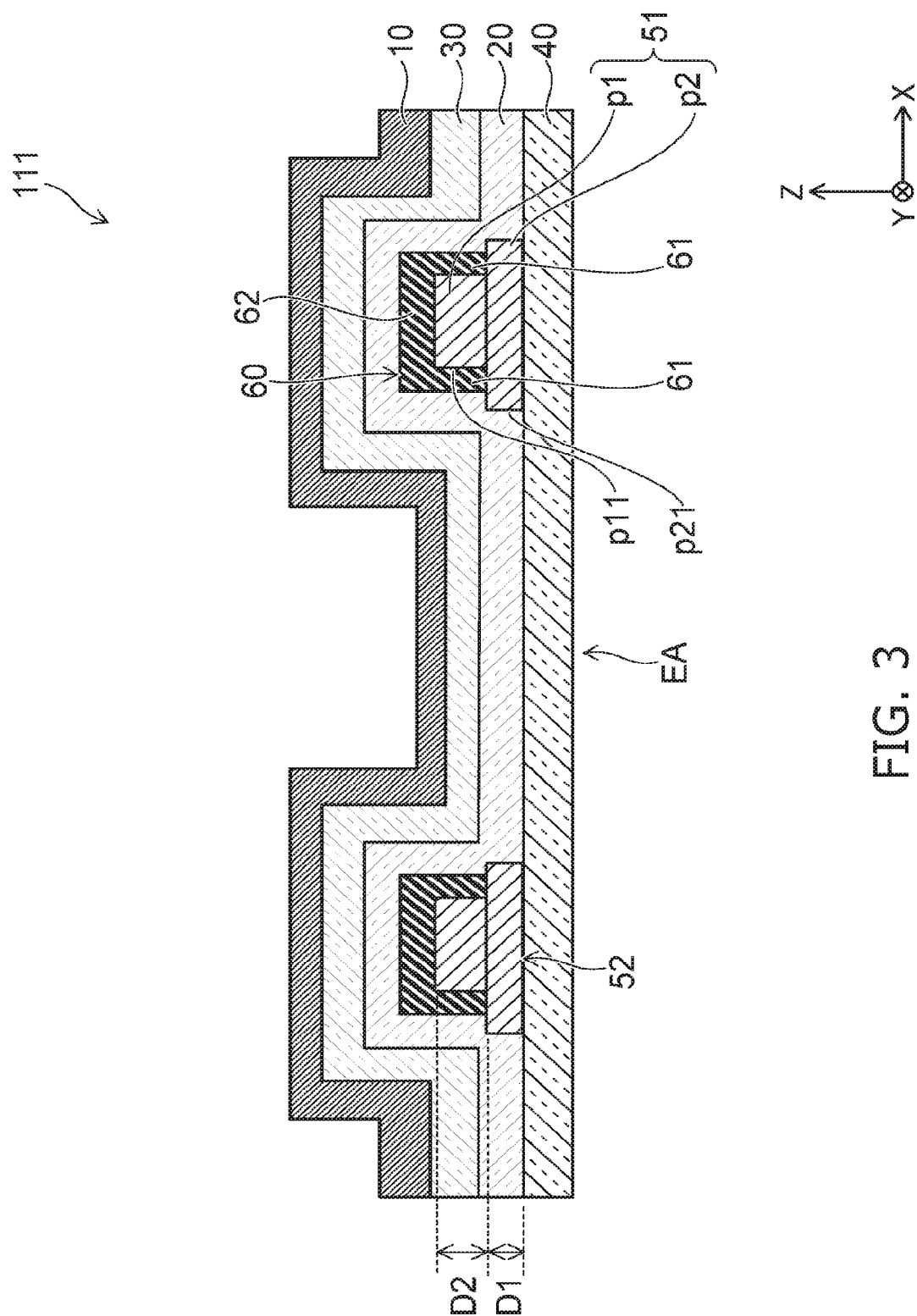
FIG. 3 is a schematic cross-sectional view showing an organic electroluminescent element according to a second embodiment.

FIG. 3 is a schematic cross-sectional view showing an organic electroluminescent element according to a second embodiment.

FIG. 4A and FIG. 4B are schematic perspective plan views showing the organic electroluminescent element according to the second embodiment.

FIG. 4B is an enlarged schematic view of the enlarged portion X1 of FIG. 4A.

The second electrode 20 and the organic light emitting layer 30 of FIG. 3 are not shown in FIG. 4A and FIG. 4B for easier viewing of the drawings.

The organic electroluminescent element 111 of the embodiment has a configuration in which the first conductive unit 51 includes a conductive unit having two different materials. In other words, the first conductive unit 51 includes the first conductive region p1 and the second conductive region p2. The light transmittance of the second conductive region p2 is higher than the light transmittance of the first conductive region p1. For example, the first conductive region p1 is a metal interconnect layer. The second conductive region p2 is a transparent conductive unit of ITO, etc. The first conductive region p1 includes a first side surface p11 aligned with the Z-axis direction. The second conductive region p2 includes a second side surface p21 aligned with the Z-axis direction. The second side surface p21 is separated from the first side surface p11 in the X-axis direction. The first conductive region p1 and a portion of the second conductive region p2 overlap in the Z-axis direction. The first insulating layer 60 covers around the first conductive region p1.

The first conductive region p1 includes, for example, at least one element selected from the group consisting of Mo, Ta, Nb, Al, Ni, and Ti. For example, a mixed film including elements selected from the group may be used as the first conductive region p1. A stacked film including these elements may be used as the first conductive region p1. The first conductive region p1 may include, for example, a stacked film of Nb/Mo/Al/Mo/Nb. For example, the first conductive region p1 functions as an auxiliary electrode that suppresses the potential drop of the second electrode 20.

The second conductive region p2 includes, for example, an oxide including at least one element selected from the group consisting of In, Sn, Zn, and Ti. The second conductive region p2 may include, for example, indium oxide, zinc oxide, tin oxide, an indium tin oxide (ITO) film, fluorine-doped tin oxide (FTO), gold, platinum, silver, copper, etc. The second conductive region p2 includes a conductive material that is transparent or semi-transparent.

The second conductive region p2 is provided on the substrate 40. The first conductive region p1 is provided on the second conductive region p2. The first insulating layer 60 is provided on the first conductive region p1. For example, patterning of the first conductive region p1, the second conductive region p2, and the first insulating layer 60 is performed using a method such as photolithography, etc. The upper surface and side surface of the first conductive region p1 are covered with the first insulating layer 60. A portion of the second conductive region p2 is disposed outside the first insulating layer 60. For example, the second conductive region p2 is patterned to be exposed from the first insulating layer 60 by an amount in the range of not less than 10 μm and not more than 50 μm.

The second electrode 20 is provided on the first insulating layer 60. The second electrode 20 is provided on a portion of the second conductive region p2 exposed from the first insulating layer 60. It is favorable for a wet process such as coating, etc., to be used to form the second electrode 20. The organic light emitting layer 30 is provided on the second electrode 20. The first electrode 10 is provided on the organic light emitting layer 30. For example, vacuum vapor deposition is used to form the first electrode 10. The region where the first insulating layer 60 is not formed is the light emitting region EA when a voltage is applied using the second electrode 20 as the anode.

In the description recited above, a portion of the second conductive region p2 is exposed from the first insulating layer 60. That is, a portion of the second conductive region p2 is positioned in the light emitting region EA. Therefore, it is favorable for a transparent conductive material such as ITO, etc., to be used as the second conductive region p2. Thereby, the surface area of the light emitting region EA is not sacrificed. Thereby, the light extraction efficiency can be increased further.

It is desirable for a second thickness D2 along the Z-axis direction of the first conductive region p1 to be thicker than a first thickness D1 along the Z-axis direction of the second conductive region p2. The second thickness D2 is, for example, not less than 10 nm and not more than 200 nm. The first thickness D1 is, for example, not less than 100 nm and not more than 800 nm. In other words, by increasing the thickness of the first conductive region p1, sufficient conductivity can be obtained without increasing the surface area of the first conductive unit 51.

According to the embodiment, the surface area of the organic electroluminescent element can be increased; and the light extraction efficiency can be increased further.

Third Embodiment

Figure 5:
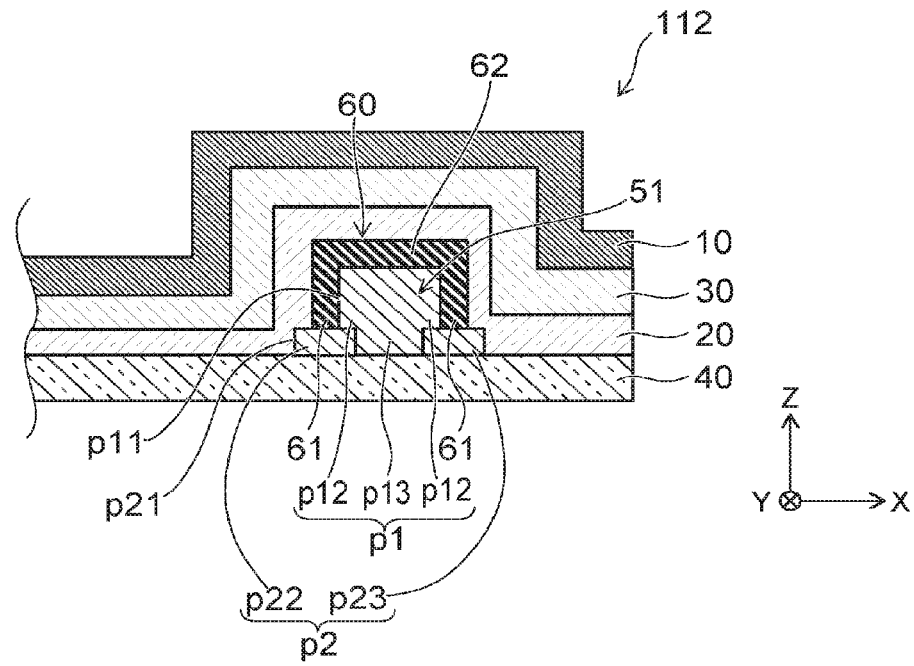
FIG. 5 is a schematic cross-sectional view showing a portion of an organic electroluminescent element according to a third embodiment.

FIG. 5 is a schematic cross-sectional view showing a portion of an organic electroluminescent element according to a third embodiment.

The organic electroluminescent element 112 of the embodiment has a configuration in which the first conductive unit 51 includes a conductive unit having two different materials. In other words, the first conductive unit 51 includes the first conductive region p1 and the second conductive region p2. The light transmittance of the second conductive region p2 is higher than the light transmittance of the first conductive region p1. For example, the first conductive region p1 is a metal interconnect layer. The second conductive region p2 is a transparent conductive unit such as ITO, etc. A portion p12 of the first conductive region p1 and a portion of the second conductive region p2 overlap in the Z-axis direction. The first insulating layer 60 covers around the first conductive region p1. In the embodiment, the first conductive region p1 is provided between the second conductive region p2 and the first insulating layer 60 and between the substrate 40 and the first insulating layer 60.

The first conductive region p1 includes the first side surface p11 that is aligned with the Z-axis direction. The second conductive region p2 includes the second side surface p21 that is aligned with the Z-axis direction. The second side surface p21 is separated from the first side surface p11 in the X-axis direction. The second conductive region p2 further includes a first portion p22 and a second portion p23. The second portion p23 is arranged with the first portion p22 in the X-axis direction. One other portion p13 of the first conductive region p1 is provided between the first portion p22 and the second portion p23 in the X-axis direction and contacts the substrate 40.

The second conductive region p2 is provided on the substrate 40. The first conductive region p1 is provided on the substrate 40 and on the second conductive region p2. The first insulating layer 60 is provided on the first conductive region p1. For example, patterning of the first conductive region p1, the second conductive region p2, and the first insulating layer 60 is performed using a method such as photolithography, etc. The front surface and side surface of the first conductive region p1 are covered with the first insulating layer 60. A portion of the second conductive region p2 is disposed outside the first insulating layer 60. For example, the second conductive region p2 is patterned to be exposed from the first insulating layer 60 by an amount in the range of not less than 10 μm and not more than 50 μm.

The second electrode 20 is provided on the first insulating layer 60. The second electrode 20 is provided on a portion of the second conductive region p2 exposed from the first insulating layer 60. It is favorable to use a wet process such as coating, etc., to form the second electrode 20. The organic light emitting layer 30 is provided on the second electrode 20. The first electrode 10 is provided on the organic light emitting layer 30. For example, vacuum vapor deposition is used to form the first electrode 10. The region where the first insulating layer 60 is not formed is the light emitting region when a voltage is applied using the second electrode 20 as the anode.

In the description recited above, a portion of the second conductive region p2 is exposed from the first insulating layer 60. That is, a portion of the second conductive region p2 is positioned in the light emitting region. Therefore, it is favorable for a transparent conductive material such as ITO, etc., to be used as the second conductive region p2. Thereby, the surface area of the light emitting region is not sacrificed. Thereby, the light extraction efficiency can be increased further.

Thus, according to the embodiment, the surface area of the organic electroluminescent element can be increased; and the light extraction efficiency can be increased further.

Fourth Embodiment

Figure 6:
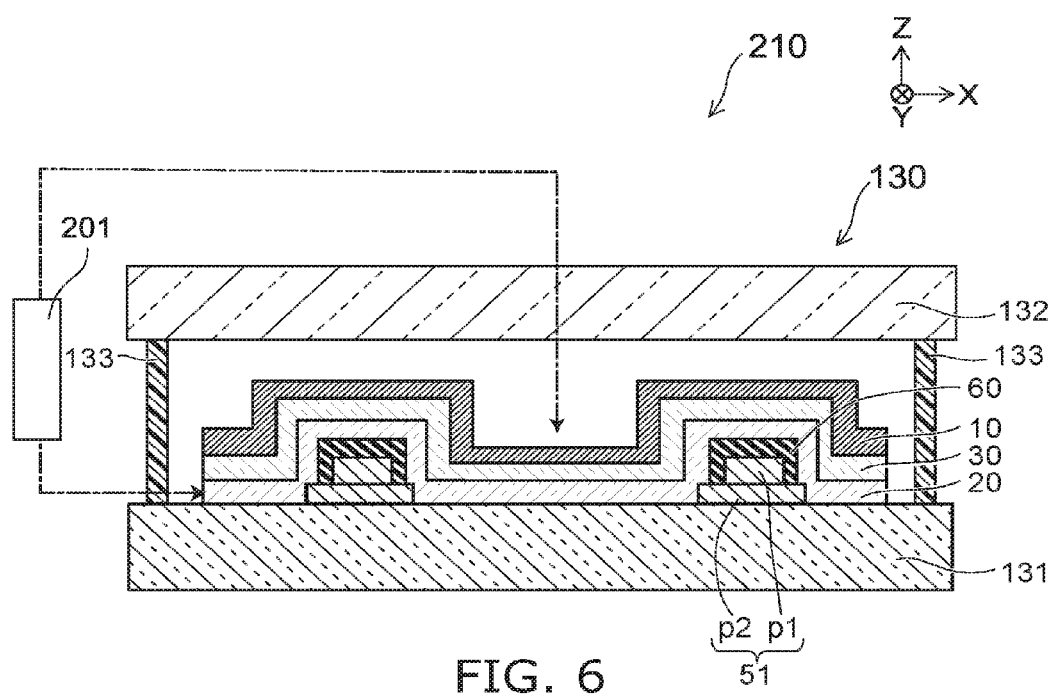
FIG. 6 is a schematic cross-sectional view showing a lighting device according to a fourth embodiment.

FIG. 6 is a schematic cross-sectional view showing a lighting device according to a fourth embodiment.

The lighting device 210 according to the embodiment includes, for example, an organic electroluminescent element 130 and a power supply unit 201. The organic electroluminescent element 130 further includes a first substrate 131, a second substrate 132, and a sealing unit 133.

As shown in FIG. 6, the second electrode 20 is provided on the first substrate 131. The first substrate 131 is light-transmissive. The second substrate 132 opposes the first substrate 131. The second substrate 132 is light-transmissive. In the example, the configuration of the stacked body is the same as the configuration described in regard to the organic electroluminescent element 111 (FIG. 3). The configuration of the stacked body may be the configuration described in regard to another organic electroluminescent element.

For example, the sealing unit 133 is provided in an annular configuration along the outer edge of the first substrate 131 and the second substrate 132 and bonds the first substrate 131 to the second substrate 132. Thereby, the stacked body is sealed with the first substrate 131 and the second substrate 132. In the organic electroluminescent element 130, the distance in the Z-axis direction between the first substrate 131 and the second substrate 132 is regulated by the sealing unit 133. For example, such a configuration can be realized including spacers (not shown) having granular configurations in the sealing unit 133. For example, the multiple spacers having the granular configurations are dispersed in the sealing unit 133; and the distance between the first substrate 131 and the second substrate 132 is regulated by the diameter of the multiple spacers.

In the organic electroluminescent element 130, the thickness (the length along the Z-axis direction) of the sealing unit 133 is, for example, not less than 1 μm and not more than 100 μm. More favorably, the thickness is, for example, not less than 5 μm and not more than 20 μm. Thereby, for example, the penetration of moisture, etc., can be suppressed. The thickness of the sealing unit 133 is, for example, substantially the same as the diameter of the spacers dispersed in the sealing unit 133.

There is a configuration of the organic electroluminescent element in which a recess is provided in the second substrate 132 to contain the stacked body. For such a configuration, it becomes difficult to form the second substrate 132. For example, this may cause a cost increase of the organic electroluminescent element.

Conversely, in the organic electroluminescent element 130 according to the embodiment, the distance between the first substrate 131 and the second substrate 132 is regulated by the sealing unit 133. Thereby, for example, the second substrate 132 having a flat plate configuration can be used. For example, the formation of the second substrate 132 can be easy. The cost increase of the organic electroluminescent element 130 can be suppressed.

For example, an inert gas, etc., is filled into the space between the stacked body and the second substrate 132. A desiccant, etc., may be provided between the stacked body and the second substrate 132. For example, the space between the stacked body and the second substrate 132 may be an air layer. For example, a liquid acrylic resin, epoxy resin, etc., may be filled into the space between the stacked body and the second substrate 132. Calcium oxide or barium oxide may be added to the acrylic resin or the epoxy resin as a desiccant.

The first substrate 131 and the second substrate 132 include, for example, a glass substrate, a resin substrate, etc. The sealing unit 133 includes, for example, an ultraviolet-curing resin, etc.

The power supply unit 201 is electrically connected with the second electrode 20 and the first electrode 10. The power supply unit 201 supplies the current to the organic light emitting layer 30 via the second electrode 20 and the first electrode 10. According to the embodiment, a lighting device suited to a greater surface area can be provided.

Fifth Embodiment

Figure 7A:
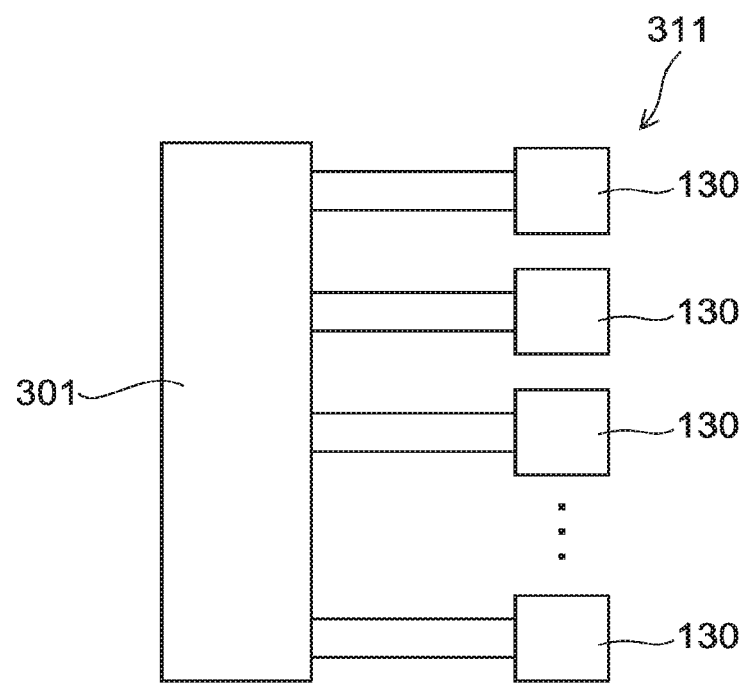
FIG. 7A and FIG. 7B are schematic views showing lighting systems according to a fifth embodiment.
Figure 7B:
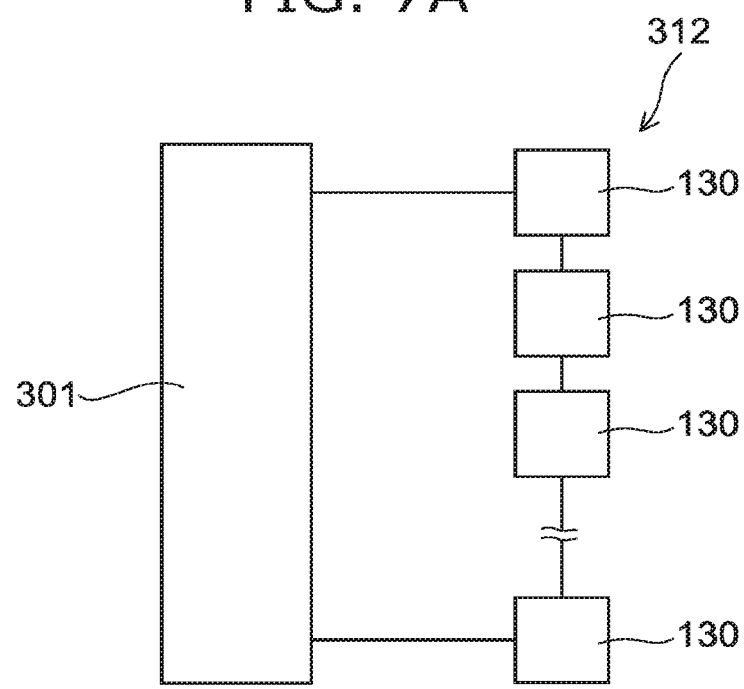

FIG. 7A and FIG. 7B are schematic views showing lighting systems according to a fifth embodiment.

As shown in FIG. 7A, a lighting system 311 according to the embodiment includes, for example, the organic electroluminescent elements 130 and a controller 301.

The controller 301 is electrically connected with each of the multiple organic electroluminescent elements 130 and controls the intensity of the light emission of each of the multiple organic electroluminescent elements 130. For example, the controller 301 is electrically connected with the first electrode and the second electrode of each of the multiple organic electroluminescent elements 130. Thereby, the controller 301 individually controls the intensity of the light emission of each of the multiple organic electroluminescent elements 130.

In a lighting system 312 as shown in FIG. 7B, the multiple organic electroluminescent elements 130 are connected in series. The controller 301 is electrically connected with the first electrode of one organic electroluminescent element 130 of the multiple organic electroluminescent elements 130. The controller 301 is electrically connected with the second electrode of one other organic electroluminescent element 130 of the multiple organic electroluminescent elements 130. Thereby, the controller 301 controls the intensity of the light emission for each of the multiple organic electroluminescent elements 130 collectively. Thus, the controller 301 may control the intensity of the light emission of each of the multiple organic electroluminescent elements 130 individually or collectively.

According to the embodiment, a lighting system suited to a greater surface area can be provided.

According to the embodiments, an organic electroluminescent element, a lighting device, and a lighting system suited to a greater surface area can be provided.

Hereinabove, embodiments of the invention are described with reference to specific examples. However, the invention is not limited to these specific examples. For example, one skilled in the art may similarly practice the invention by appropriately selecting specific configurations of components such as the substrate, the first electrode, the second electrode, the organic layer and the first conductive unit, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all organic electroluminescent elements, lighting devices and lighting systems practicable by an appropriate design modification by one skilled in the art based on the organic electroluminescent elements, lighting devices and lighting systems described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An organic electroluminescent element, comprising:
   a substrate being light-transmissive;
   a first electrode;
   a second electrode provided between the substrate and the first electrode, the second electrode being light-transmissive and including a first region and a second region, a direction connecting the first region and the second region intersecting a first direction connecting the substrate and the first electrode;
   an organic layer provided between the second electrode and the first electrode;
   a first conductive unit provided between the first region and a portion of the substrate and electrically connected with the second electrode, the first conductive unit including a third region and a fourth region, a portion of the fourth region being disposed between the substrate and at least a portion of the third region; and a first insulating layer including a fifth region provided between the third region and the second region in a second direction intersecting the first direction, one other portion of the fourth region not overlapping the fifth region in the first direction, and the one other portion of the fourth region contacting the second electrode.

2. The element according to claim 1, wherein the first insulating layer further includes a sixth region provided between the first conductive unit and the first region.

3. The element according to claim 1, further comprising:
a second conductive unit; and
a second insulating layer,
the second electrode further including a seventh region and an eighth region,
a direction connecting the first region and the seventh region being aligned with the second direction,
a direction connecting the second region and the eighth region being aligned with the second direction,
the second conductive unit being provided between the seventh region and one other portion of the substrate and electrically connected with the second electrode,
the second conductive unit including a ninth region and a tenth region, a portion of the tenth region being disposed between the substrate and at least a portion of the ninth region,
the second insulating layer including an eleventh region provided between the ninth region and the eighth region in the second direction.

4. The element according to claim 3, wherein the second insulating layer further includes a twelfth region provided between the second conductive unit and the seventh region.

5. The element according to claim 3, wherein the substrate contacts the second electrode between the first conductive unit and the second conductive unit.

6. The element according to claim 1, wherein a thickness along the first direction of the third region is thicker than a thickness along the first direction of the fourth region.

7. The element according to claim 1, wherein the first conductive unit further includes a side surface intersecting the first direction.

8. The element according to claim 7, wherein the first conductive unit includes at least one element selected from the group consisting of Mo, Ta, Nb, Al, Ni, and Ti.

9. The element according to claim 1, wherein
the third region further includes a first side surface aligned with the first direction, and
the fourth region further includes a second side surface aligned with the first direction and separated from the first side surface in the second direction.

10. The element according to claim 9, wherein
the fourth region further includes a first portion, and a second portion arranged with the first portion in the second direction, and
one other portion of the third region is provided between the first portion and the second portion in the second direction and contacts the substrate.

11. The element according to claim 9, wherein a light transmittance of the fourth region is higher than a light transmittance of the third region.

12. The element according to claim 9, wherein
the third region includes at least one element selected from the group consisting of Mo, Ta, Nb, Al, Ni, and Ti, and
the fourth region includes an oxide including at least one element selected from the group consisting of In, Sn, Zn, and Ti.

13. The element according to claim 1, wherein a light reflectance of the first electrode is higher than a light reflectance of the second electrode.

14. The element according to claim 1, wherein a refractive index of the second electrode is higher than a refractive index of the substrate and lower than a refractive index of the organic layer.

15. The element according to claim 14, wherein the refractive index of the second electrode is 1.6 or less.

16. The element according to claim 1, wherein the second electrode includes polyethylene dioxythiophene.

17. The element according to claim 1, wherein the first insulating layer includes one of silicon oxide, silicon nitride, or silicon oxynitride.

18. An organic electroluminescent element, comprising:
a substrate being light-transmissive;
a first electrode;
a second electrode provided between the substrate and the first electrode, the second electrode being light-transmissive and including a first region and a second region, a direction connecting the first region and the second region intersecting a first direction connecting the substrate and the first electrode;
an organic layer provided between the second electrode and the first electrode;
a first conductive unit provided between the first region and a portion of the substrate and electrically connected with the second electrode, the first conductive unit including a third region and a fourth region, a portion of the fourth region being disposed between the substrate and at least a portion of the third region;
an other portion of the fourth region contacting the second electrode;
wherein a cross-sectional shape of the first conductive unit is a trapezoid, and
wherein the first conductive unit contacts the second electrode at lower portion of the trapezoid.

19. An organic electroluminescent element, comprising:
a substrate being light-transmissive;
a first electrode;
a second electrode provided between the substrate and the first electrode, the second electrode being light-transmissive and including a first region and a second region, a direction connecting the first region and the second region intersecting a first direction connecting the substrate and the first electrode;
an organic layer provided between the second electrode and the first electrode;
a first conductive unit provided between the first region and a portion of the substrate and electrically connected with the second electrode, the first conductive unit including a third region and a fourth region, a portion of the fourth region being disposed between the substrate and at least a portion of the third region;
an other portion of the fourth region contacting the second electrode;
wherein a cross-sectional shape of the first conductive unit is a trapezoid, and
wherein the first conductive unit contacts the second electrode at lower portion of the trapezoid
wherein a length of the third region in a direction crossing the first direction is shorter than a length of the fourth region in the direction crossing.

* * * * *